(12) United States Patent
Wang (10) Patent No.: US 11,696,471 B2
(45) Date of Patent: Jul. 4, 2023

(54) ARRAY SUBSTRATE INCLUDING A SECOND ELECTRODE OF THE SECOND CAPACITOR DISPOSED ON THE SAME LAYER WITH THE POWER SUPPLY VOLTAGE LINE, OLED DISPLAY PANEL, AND DISPLAY DEVICE HAVING THE SAME

(71) Applicant: BOE Technology Group Co., Ltd., Beijing (CN)

(72) Inventor: Zhichong Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 216 days.

(21) Appl. No.: 17/212,009

(22) Filed: Mar. 25, 2021

(65) Prior Publication Data
US 2022/0028948 A1 Jan. 27, 2022
US 2023/0093791 A9 Mar. 23, 2023

(30) Foreign Application Priority Data

Jul. 24, 2020 (CN) .......................... 202010721837.0

(51) Int. Cl.
*H01L 29/12* (2006.01)
*H10K 59/121* (2023.01)
*H10K 59/131* (2023.01)

(52) U.S. Cl.
CPC ..... *H10K 59/1216* (2023.02); *H10K 59/1213* (2023.02); *H10K 59/131* (2023.02)

(58) Field of Classification Search
CPC ............. H01L 27/3265; H01L 27/3262; H01L 27/3276

USPC .......................................................... 257/71
See application file for complete search history.

(56) References Cited

U.S. PATENT DOCUMENTS

| 9,647,009 | B1 | 5/2017 | Zhao et al. |
| 2015/0340385 | A1 | 11/2015 | Li et al. |
| 2017/0053975 | A1* | 2/2017 | Cho .................... H01L 27/1288 |
| 2017/0207251 | A1 | 7/2017 | Liu |

(Continued)

FOREIGN PATENT DOCUMENTS

| CN | 103715207 A | 4/2014 |
| CN | 104965362 A | 10/2015 |

(Continued)

OTHER PUBLICATIONS

Chinese Office Action for corresponding application 202010721837.0 dated Mar. 15, 2021.

*Primary Examiner* — Phuc T Dang
(74) *Attorney, Agent, or Firm* — ArentFox Schiff LLP; Michael Fainberg (57) ABSTRACT

The disclosure discloses an array substrate, an OLED display panel and a display device. A storage capacitor includes a first capacitor and a second capacitor which are connected in parallel, wherein the first capacitor includes a storage electrode and a first electrode, a layer where the first electrode is located is same as a layer where the grid electrode of the driving transistor is located, the second capacitor includes the storage electrode and a second electrode, a layer where the second electrode is located is same as a layer where the power supply voltage line is located, and the first electrode and the second electrode are electrically connected through a via hole penetrating through a first insulating layer and a second insulating layer.

17 Claims, 9 Drawing Sheets

(56) References Cited

U.S. PATENT DOCUMENTS

| | | | |
|---|---|---|---|
| 2018/0011356 A1 | 1/2018 | Kong | |
| 2018/0286307 A1* | 10/2018 | Kim | ................. G09G 3/3283 |
| 2020/0119121 A1 | 4/2020 | Chen | |
| 2020/0168638 A1* | 5/2020 | Je | ................. H01L 29/78675 |
| 2020/0212077 A1* | 7/2020 | Jang | ................. H01L 27/1255 |

FOREIGN PATENT DOCUMENTS

| | | |
|---|---|---|
| CN | 105487315 A | 4/2016 |
| CN | 105679765 A | 6/2016 |
| CN | 106910748 A | 6/2017 |
| CN | 107402487 A | 11/2017 |
| CN | 108288455 A | 7/2018 |
| CN | 109148480 A | 1/2019 |
| CN | 110610684 A | 12/2019 |

* cited by examiner

--prior art--

ARRAY SUBSTRATE INCLUDING A SECOND ELECTRODE OF THE SECOND CAPACITOR DISPOSED ON THE SAME LAYER WITH THE POWER SUPPLY VOLTAGE LINE, OLED DISPLAY PANEL, AND DISPLAY DEVICE HAVING THE SAME

CROSS-REFERENCE TO RELATED APPLICATION

This application claims priority to Chinese Patent Application No. 202010721837.0, filed by the China National Intellectual Property Administration on Jul. 24, 2020, the entire contents of which are incorporated herein by reference.

FIELD

The present disclosure relates to the technical field of display, in particular to an array substrate, an OLED display panel and a display device.

BACKGROUND

An Organic Light Emitting Diode (OLED) is one of the hotspots in the field of display research nowadays. Compared with a Liquid Crystal Display (LCD), the OLED has the advantages of low energy consumption, low production cost, self-luminescence, wide viewing angle, fast response speed and so on. At present, OLED display screens have begun to replace traditional LCD display screens in the display field of mobile phones, PDAs, digital cameras and so on.

SUMMARY

The embodiments of the present disclosure provide an array substrate, an OLED display panel and a display device.

In a first aspect, embodiments of the present disclosure provide an array substrate, including: a base substrate and a pixel circuit disposed on the base substrate, wherein the pixel circuit at least includes a driving transistor, a storage capacitor and a power supply voltage line; one end of the storage capacitor is electrically connected with the power supply voltage line, and the other end of the storage capacitor is electrically connected with a grid electrode of the driving transistor; an active layer, a grid insulating layer, the grid electrode of the driving transistor, a first insulating layer, a storage electrode, a second insulating layer and the power supply voltage line are sequentially disposed on the base substrate; and the storage capacitor includes a first capacitor and a second capacitor, the first capacitor and the second capacitor are connected in parallel; the first capacitor includes the storage electrode and a first electrode, a layer where the first electrode is located is same as a layer where the grid electrode of the driving transistor is located; the second capacitor includes the storage electrode and a second electrode, a layer where the second electrode is located is same as a layer where the power supply voltage line is located; and the first electrode and the second electrode are electrically connected through a via hole penetrating through the first insulating layer and the second insulating layer.

Optionally, in the array substrate provided by the embodiments of the present disclosure, the storage electrode of the storage capacitor is electrically connected with the power supply voltage line; and the first electrode of the storage capacitor is electrically connected with the grid electrode of the driving transistor.

Optionally, in the array substrate provided by the embodiments of the present disclosure, the storage electrode of the storage capacitor is electrically connected with the grid electrode of the driving transistor; and the second electrode of the storage capacitor is electrically connected with the power supply voltage line.

Optionally, in the array substrate provided by the embodiments of the present disclosure, an orthographic projection of the storage electrode on the base substrate has an overlapping area with an orthographic projection of the first electrode on the base substrate.

Optionally, in the array substrate provided by the embodiments of the present disclosure, an orthographic projection of the storage electrode on the base substrate has an overlapping area with an orthographic projection of the second electrode on the base substrate.

Optionally, in the array substrate provided by the embodiments of the present disclosure, an orthographic projection of the second electrode on the base substrate coincides with an orthographic projection of the first electrode on the base substrate.

Optionally, the array substrate provided by the embodiments of the present disclosure further includes source and drain electrodes, a layer where the source and drain electrodes are located is same as the layer where the power supply voltage line is located.

Optionally, the array substrate provided by the embodiments of the present disclosure further includes a data line, a layer where the data line is located is same as the layer where the power supply voltage line is located.

In a second aspect, embodiments of the present disclosure also provide an OLED display panel, including any above array substrate provided in the embodiments of the present disclosure.

In a third aspect, embodiments of the present disclosure also provide a display device, including the above OLED display panel provided in the embodiment of the present disclosure.

DETAILED DESCRIPTION OF THE EMBODIMENTS

In an OLED display panel, an OLED needs to be driven by a pixel circuit which is mainly composed of a storage capacitor and a plurality of transistors. With the higher and higher requirements for product resolution, the layout space of each pixel needs to be reduced if the PPI is to be further improved without affecting the internal compensation effect of the pixel circuit, but after the layout space is reduced, the storage capacitor is reduced, so that the voltage stabilizing capability is insufficient.

At present, the pixel circuit in the OLED display panel mainly adopts a 7T1C structure or an 8T1C structure. For example, in the pixel circuit shown in FIG. 1, there are so many transistors (T1-T7) in the pixel circuit to limit the enhancement of the PPI of the display panel.

Figure 2:
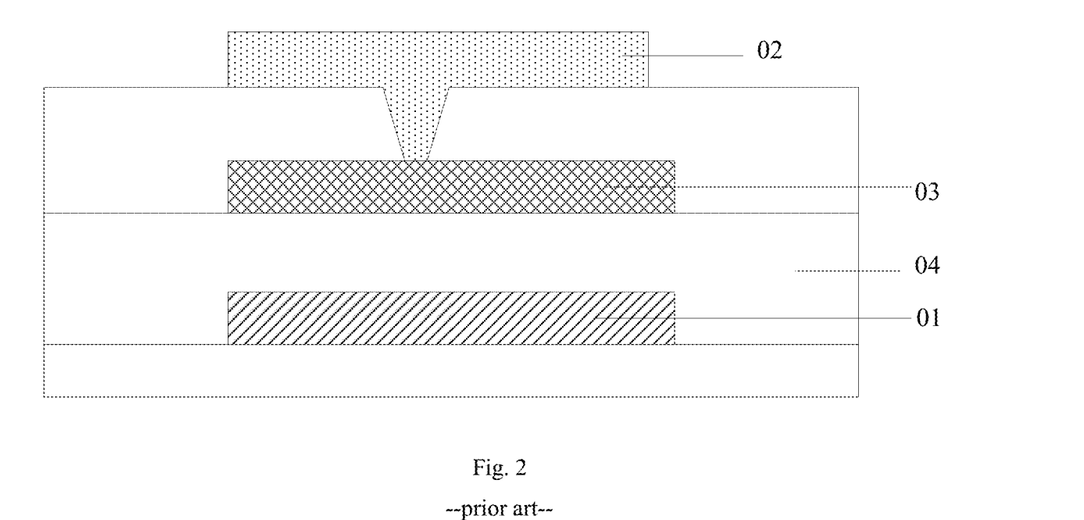
FIG. 2 is a structural schematic diagram of a capacitor in the existing pixel circuit.

In order to secure a capacitance value of a storage capacitor Cst in the display panel in the prior art, as shown in FIG. 2, a storage electrode layer 03 is disposed between a grid electrode layer 01 and a source and drain electrode layer 02 to secure a target capacitance value within a defined area by providing a grid insulating layer 04 having a relatively high dielectric constant and a relatively small thickness. As shown in FIG. 2, the grid electrode layer 01 is connected with a grid electrode of a driving transistor, the source and drain electrode layer 02 providing a VDD signal is connected with the storage electrode layer 03 through a via hole, and the grid electrode layer 01 and the storage electrode layer 03 form the storage capacitor Cst. However, as mentioned above, in the prior art, on the premise that the internal compensation effect is not affected, if the PPI needs to be further improved, the layout space of each pixel needs to be reduced, the layout of wiring and the via hole inevitably faces the challenge of insufficient space, and after the layout space is reduced, the capacitance value of the storage capacitor Cst is reduced, so that the voltage stabilizing capability of the storage capacitor Cst is insufficient.

Therefore, the embodiments of the present disclosure provide an array substrate, an OLED display panel and a display device.

To further make the above objects, features and advantages of the present disclosure obvious and easily understandable, a more particular description of the present disclosure will be rendered by reference to the appended drawings and embodiments. However, the exemplary implementations can be implemented in a variety of forms and should not be construed as limitation to the implementations set forth herein; and on the contrary, these implementations are provided so that the present disclosure will be comprehensive and complete, and the concept of the exemplary implementations is fully conveyed to those skilled in the art. In the drawings, the same reference signs denote the same or similar structures, and thus a repeated description thereof will be omitted. The terms expressing positions and orientations described in the present disclosure are illustrated by way of example in the accompanying drawings and may be varied as required, and the variations are intended to be within the scope of the present disclosure. The drawings of the present disclosure are only intended to illustrate relative positional relationships and do not indicate the real scale.

It should be noted that in the following description, specific details are set forth in order to thoroughly understand the present disclosure. The present disclosure may, however, be embodied in many different forms than those herein set forth, and those skilled in the art can make similar extension without departing from the spirit or scope of the present disclosure. The present disclosure is therefore not to be limited by the specific implementations disclosed below. The follow-up specification describes the preferred implementation for carrying out the present application, but is for the purpose of illustrating the general principles of the present application and is not intended to limit the scope of the present application. The scope of the present application is defined based on the appended claims.

The array substrate, the OLED display panel and the display device provided by the embodiments of the present disclosure will be described in detail with reference to the accompanying drawings.

Figure 3:
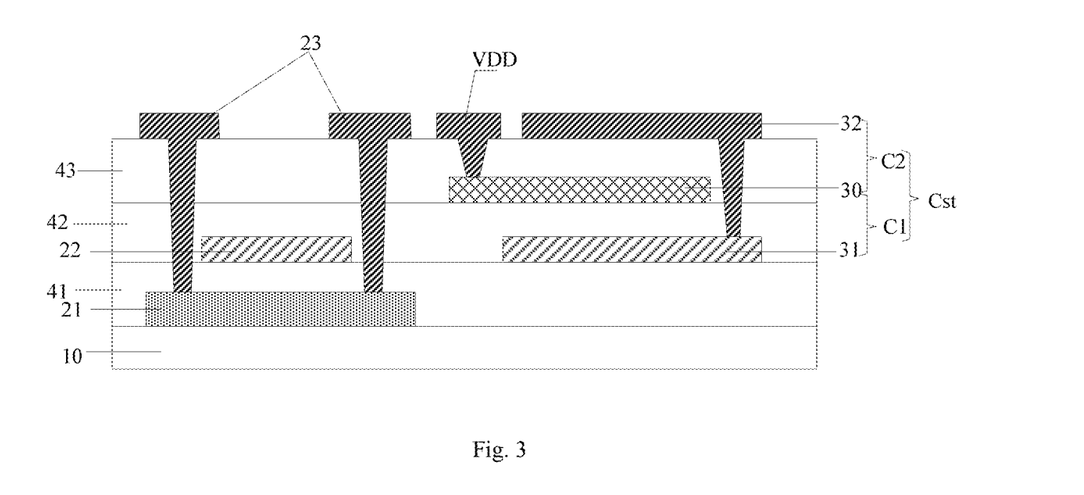
FIG. 3 is one structural schematic diagram of an array substrate according to an embodiment of the present disclosure.
Figure 4:
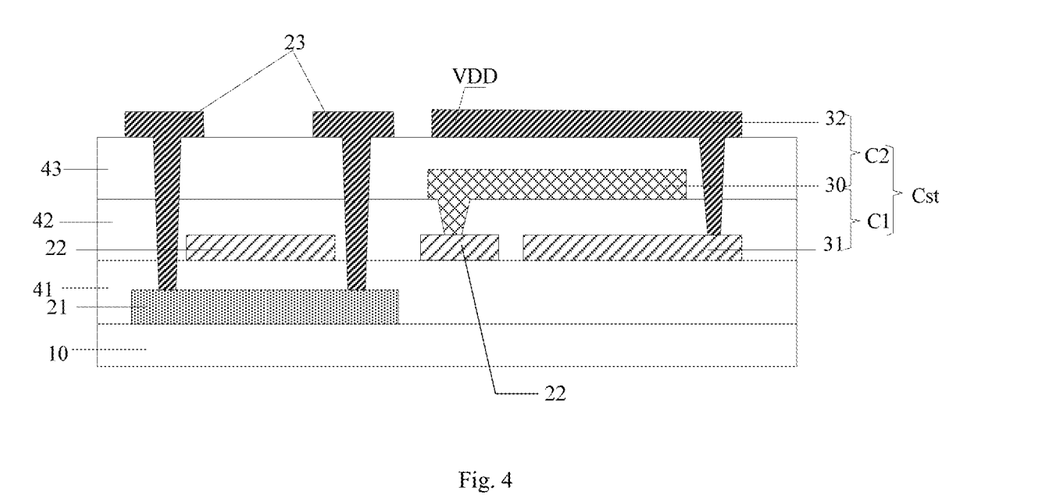
FIG. 4 is another structural schematic diagram of an array substrate according to an embodiment of the present disclosure.

An array substrate provided by an embodiment of the present disclosure, as shown in FIG. 3 and FIG. 4, includes: a base substrate 10 and a pixel circuit on the base substrate 10, wherein the pixel circuit at least includes a driving transistor, a storage capacitor Cst and a power supply voltage line VDD; and one end of the storage capacitor Cst is electrically connected with the power supply voltage line VDD, and the other end of the storage capacitor Cst is electrically connected with a grid electrode 22 of the driving transistor.

Figure 1:
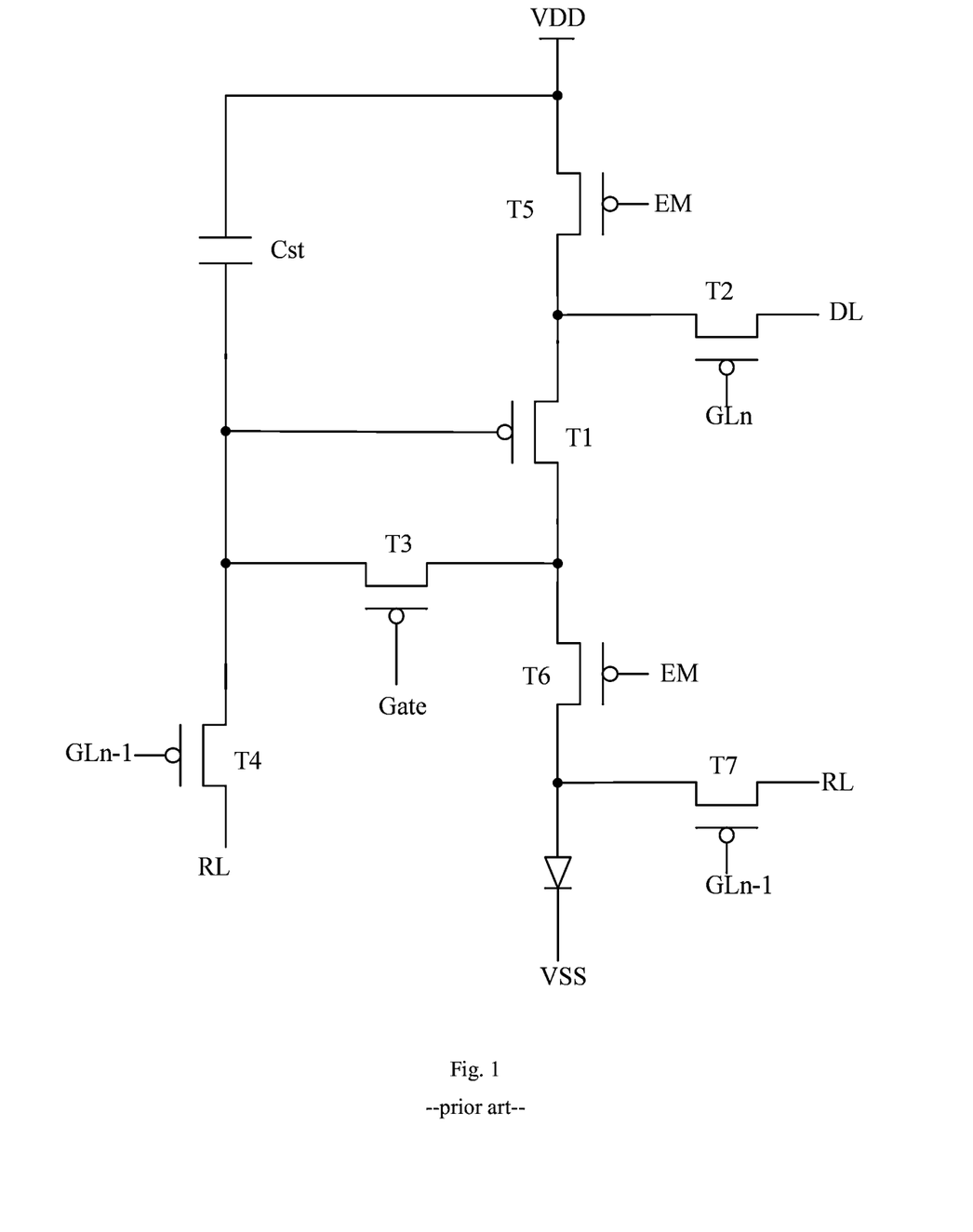
FIG. 1 is a structural schematic diagram of an existing pixel circuit.

In a particular implementation, the pixel circuit includes other transistors in addition to the driving transistor, such as transistors in FIG. 1 other than T1. Typically, layers with the same function in all transistors of the pixel circuit are disposed on the same layer.

Referring to FIG. 3 and FIG. 4, an active layer 21, a grid insulating layer 41, the grid electrode 22 of the driving transistor, a first insulating layer 42, a storage electrode 30, a second insulating layer 43 and the power supply voltage line VDD are sequentially disposed on the base substrate 10.

The storage capacitor Cst includes a first capacitor C1 and a second capacitor C2, and the first capacitor and the second capacitor are connected in parallel; wherein the first capacitor C1 includes the storage electrode 30 and a first electrode 31, a layer where the first electrode 31 is located is same as a layer where the grid electrode 22 of the driving transistor is located; the second capacitor C2 includes the storage electrode 30 and a second electrode 32, a layer where the second electrode 32 is located is same as a layer where the power supply voltage line VDD is located, and the first electrode 31 and the second electrode 32 are electrically connected through a via hole penetrating through the first insulating layer 42 and the second insulating layer 43.

According to the above array substrate provided by the embodiments of the present disclosure, the storage capacitor includes the first capacitor and the second capacitor which are connected in parallel, wherein the first capacitor includes the storage electrode and the first electrode, a layer where the first electrode is located is same as a layer where the grid electrode of the driving transistor is located, the second capacitor includes the storage electrode and the second electrode, a layer where the second electrode is located is same as a layer where the power supply voltage line is located, and the first electrode and the second electrode are electrically connected through the via hole penetrating through the first insulating layer and the second insulating layer. Therefore, compared with the prior art, the array substrate has the features that the capacitance value of the storage capacitor can be increased on the basis of the same occupied area, or the occupied area can be reduced on the basis of ensuring the same capacitance value of the storage capacitor, so that the pixel PPI of the display panel is improved under the same internal compensation pixel circuit structure.

Optionally, in the array substrate provided by the embodiments of the present disclosure, as shown in FIG. 3 and FIG. 4, the base substrate 10 further includes source and drain electrodes 23, and a layer where the source and drain electrodes 23 are located is same as the layer where the power supply voltage line VDD is located, which makes it possible to form patterns of the power supply voltage line VDD and the source and drain electrodes 23 by a one-time patterning process, thereby simplifying the process steps.

Optionally, in the array substrate provided by the embodiments of the present disclosure, as shown in FIG. 3, the storage electrode 30 of the storage capacitor Cst is electrically connected with the power supply voltage line VDD, and the first electrode 31 of the storage capacitor Cst is electrically connected with the grid electrode 22 of the driving transistor. Therefore, one end of the storage capacitor Cst is electrically connected with the power supply voltage line VDD, and the other end of the storage capacitor Cst is electrically connected with the grid electrode 22 of the driving transistor.

Further, in the above embodiments, the first electrode 31 of the storage capacitor Cst and the grid electrode 22 of the driving transistor may be of an integrated structure.

Alternatively, optionally, in the array substrate provided by the embodiments of the present disclosure, as shown in FIG. 4, the storage electrode 30 of the storage capacitor Cst is electrically connected with the grid electrode 22 of the driving transistor; and the second electrode 32 of the storage capacitor Cst is electrically connected with the power supply voltage line VDD. Therefore, one end of the storage capacitor Cst is electrically connected with the power supply voltage line VDD, and the other end of the storage capacitor Cst is electrically connected with the grid electrode 22 of the driving transistor.

Further, in the above embodiments, the second electrode 32 and the power supply voltage line VDD may be of an integrated structure.

Optionally, in the array substrate provided by the embodiments of the present disclosure, an orthographic projection of the storage electrode on the base substrate has an overlapping area with an orthographic projection of the first electrode on the base substrate. Therefore, a capacitance value of the first capacitor formed by the storage electrode and the first electrode is as large as possible.

Optionally, in the array substrate provided by the embodiments of the present disclosure, the orthographic projection of the storage electrode on the base substrate has an overlapping area with an orthographic projection of the second electrode on the base substrate. Therefore, a capacitance value of the second capacitor formed by the storage electrode and the second electrode is as large as possible.

Optionally, in the array substrate provided by the embodiments of the present disclosure, the orthographic projection of the second electrode on the base substrate coincides with the orthographic projection of the first electrode on the base substrate.

Optionally, in the array substrate provided by the embodiments of the present disclosure, the base substrate further includes a data line, and the power supply voltage line and the data line are disposed on the same layer. In this way, patterns of the power supply voltage line and the data line are formed through the one-time patterning process, thereby simplifying the process steps.

By taking the pixel circuit shown in FIG. 1 as an example in combination the structure of the storage capacitor shown in FIG. 3, the preparation of the array substrate provided by the embodiments of the present disclosure may include the following steps.

Figure 5A:
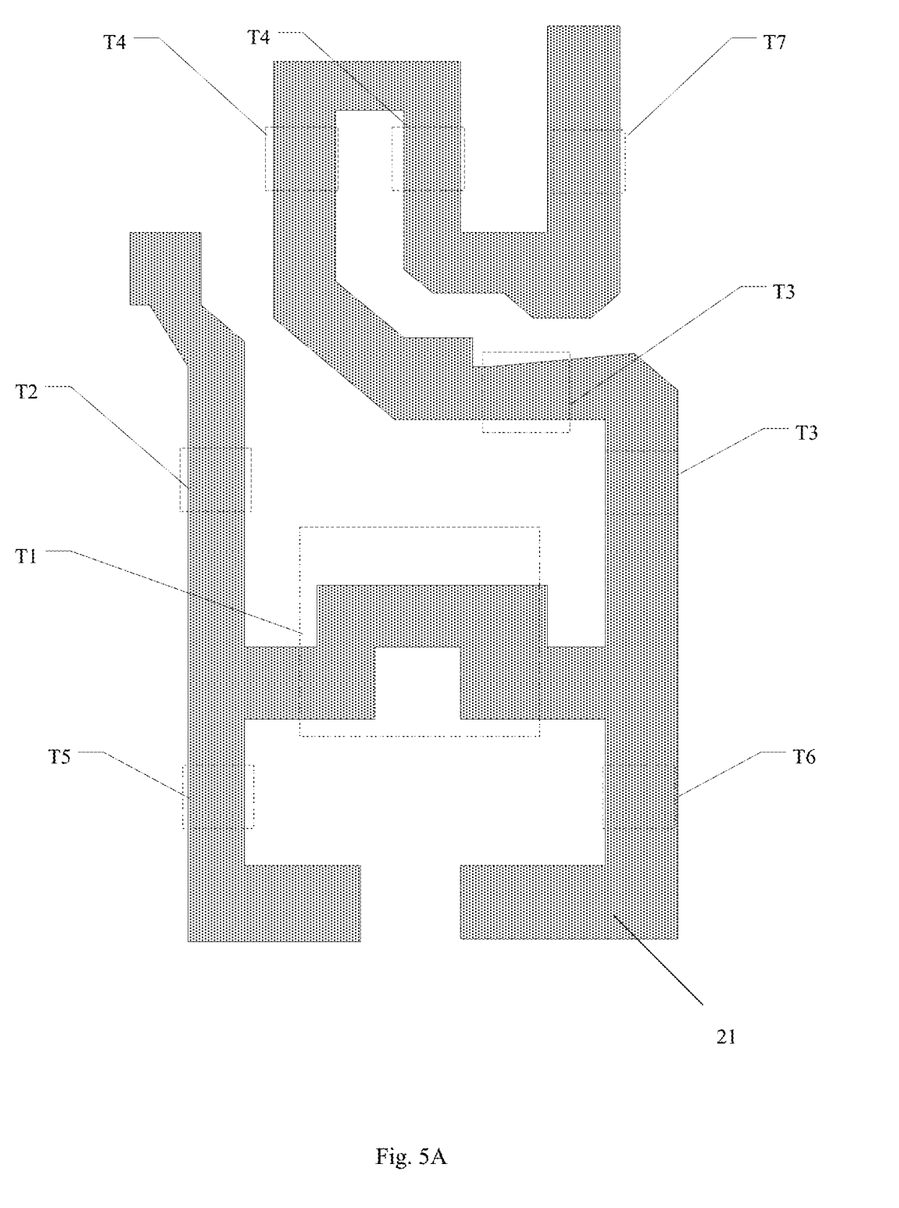
FIG. 5A is a top view corresponding to a step in the preparation of an array substrate according to an embodiment of the present disclosure.

(1) As shown in FIG. 5A, a pattern of the active layer 21 is formed on the base substrate to be subsequently used as channels and inter-transistor leads of transistors T1-T7.

(2) The grid insulating layer is formed by deposition, wherein the material of the grid insulating layer may be silicon oxide or silicon nitride and the like.

Figure 5B:
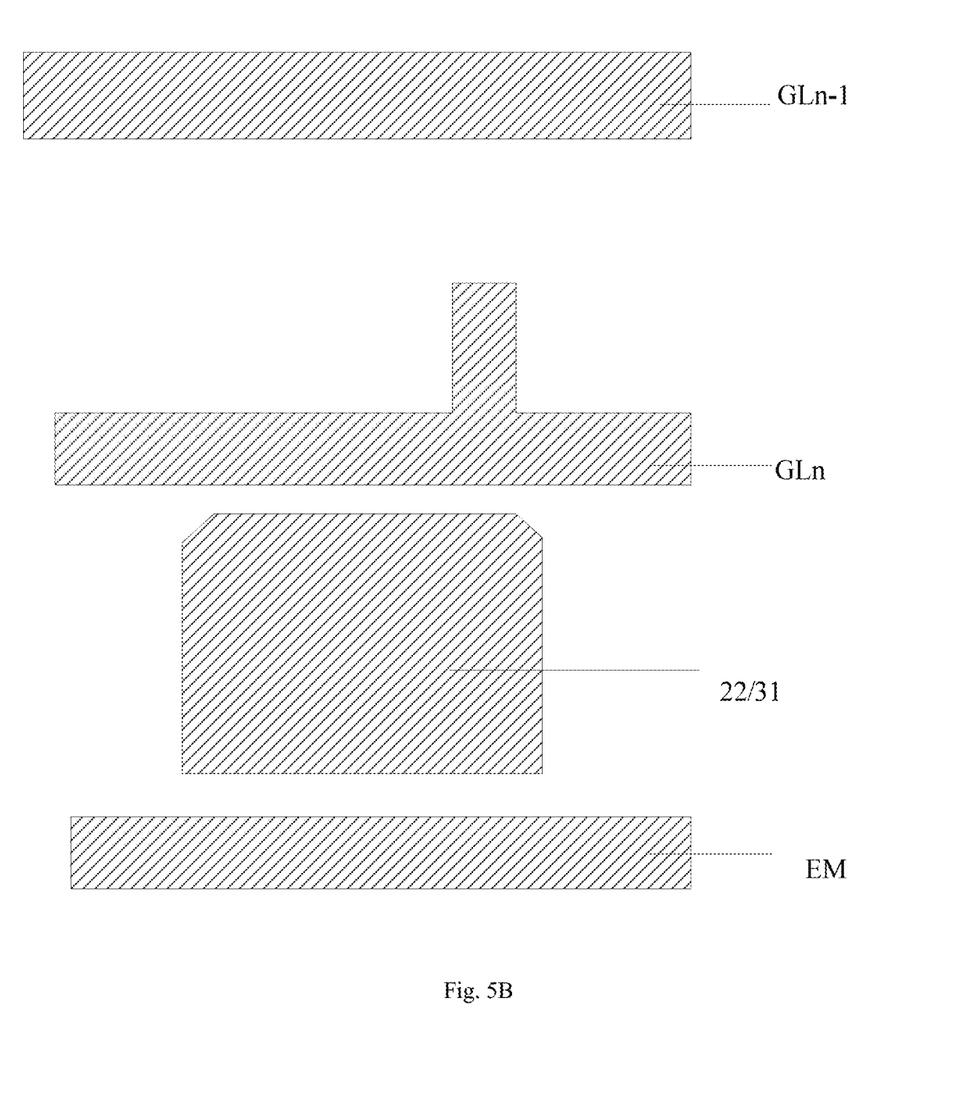
FIG. 5B is a top view corresponding to another step in the preparation of an array substrate according to an embodiment of the present disclosure.

(3) As shown in FIG. 5B, patterns of grid electrodes of the transistors and the first electrode 31 of the storage capacitor are formed, wherein the grid electrode 22 of the driving transistor and the first electrode 31 of the storage capacitor may be of an integrated structure, and in addition to the grid electrode 22 of the driving transistor, the grid electrodes of other transistors may be of an integrated structure together with control lines GLn−1, GLn or EM.

(4) The first insulating layer is formed by deposition, wherein the material of the first insulating layer may be silicon oxide or silicon nitride and the like.

Figure 5C:
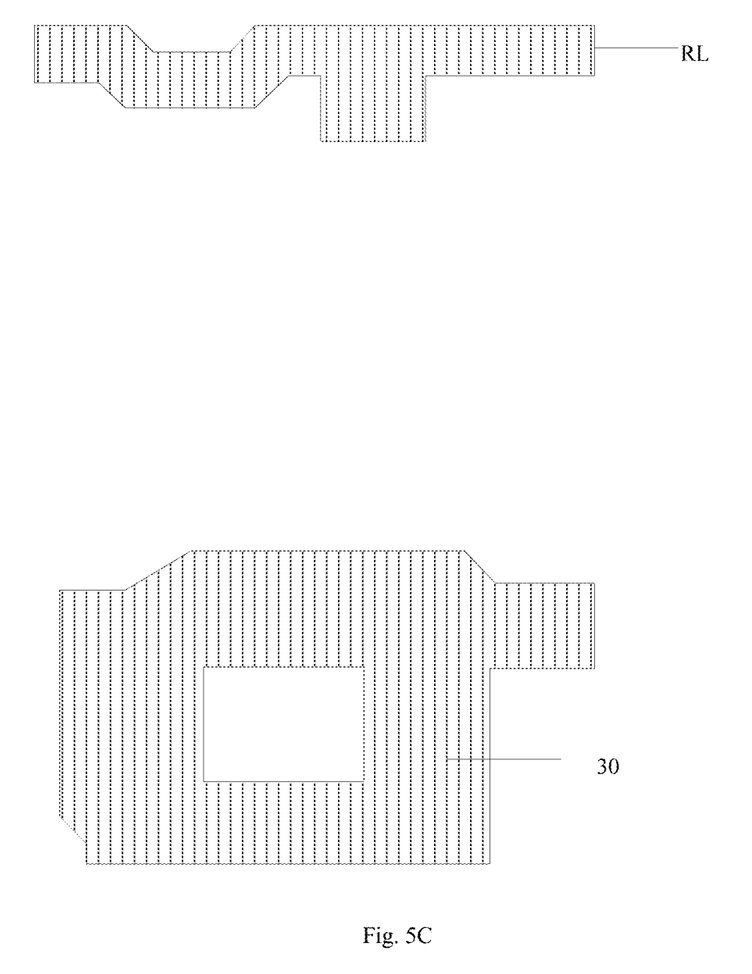
FIG. 5C is a top view corresponding to another step in the preparation of an array substrate according to an embodiment of the present disclosure.

(5) As shown in FIG. 5C, a pattern of the storage electrode 30 of the storage capacitor and a reference line RL is formed, wherein the orthographic projection of the storage electrode 30 on the base substrate may cover the orthographic projection of the first electrode 31 on the base substrate.

(6) The second insulating layer is deposited, wherein the material of the second insulating layer may be silicon oxide or silicon nitride and the like.

(7) A via hole (for connecting the power supply voltage line with the storage electrode) penetrating through the second insulating layer, the via hole (for connecting the first electrode and the second electrode of the storage capacitor) penetrating through the first insulating layer and the second insulating layer, and a via hole (for connecting the source and drain electrodes with the active layer) penetrating through the grid insulating layer, the first insulating layer and the second insulating layer are formed.

Figure 5D:
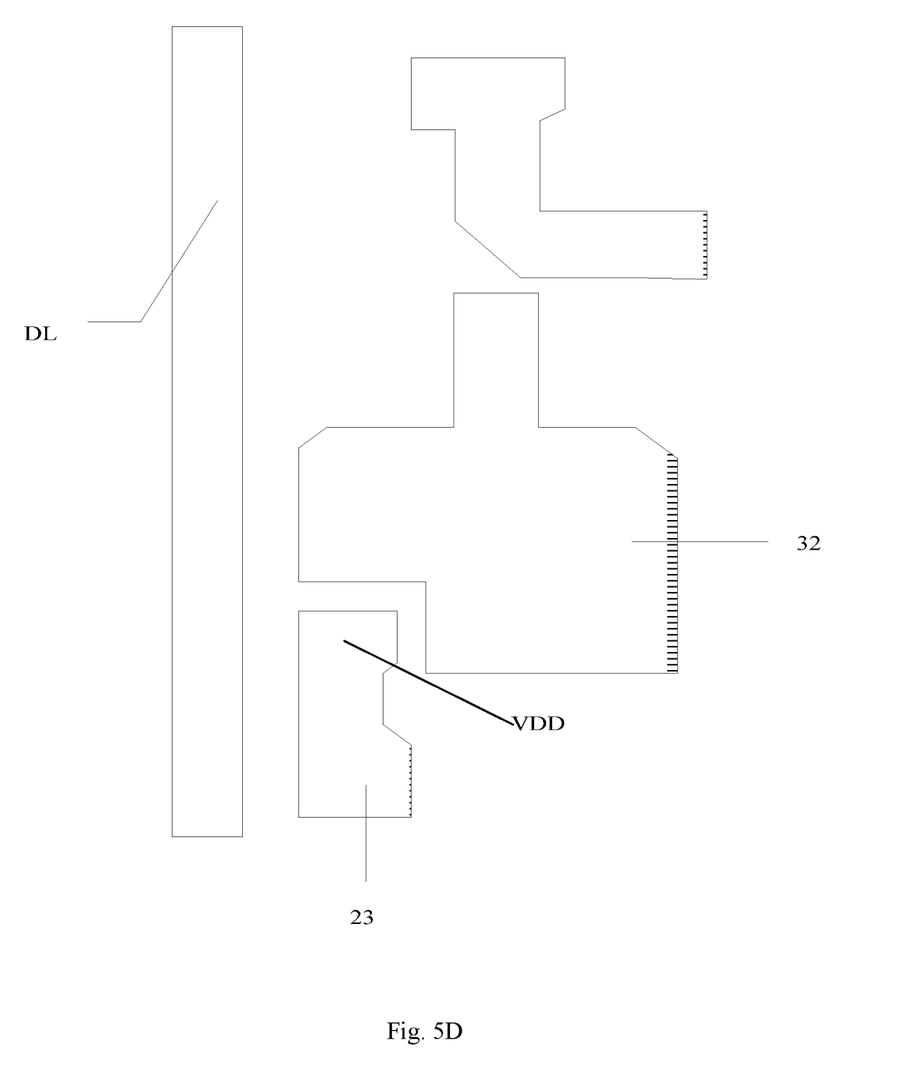
FIG. 5D is a top view corresponding to another step in the preparation of an array substrate according to an embodiment of the present disclosure.

(8) As shown in FIG. 5D, a pattern of the source and drain electrodes 23, a pattern of the data line DL, a pattern of the power supply voltage line, and a pattern of the second electrode 32 of the storage capacitor are formed. Under spatially allowed conditions, the orthographic projection of the second electrode 32 on the base substrate coincides with the orthographic projection of the storage electrode 30 on the base substrate.

Figure 5E:
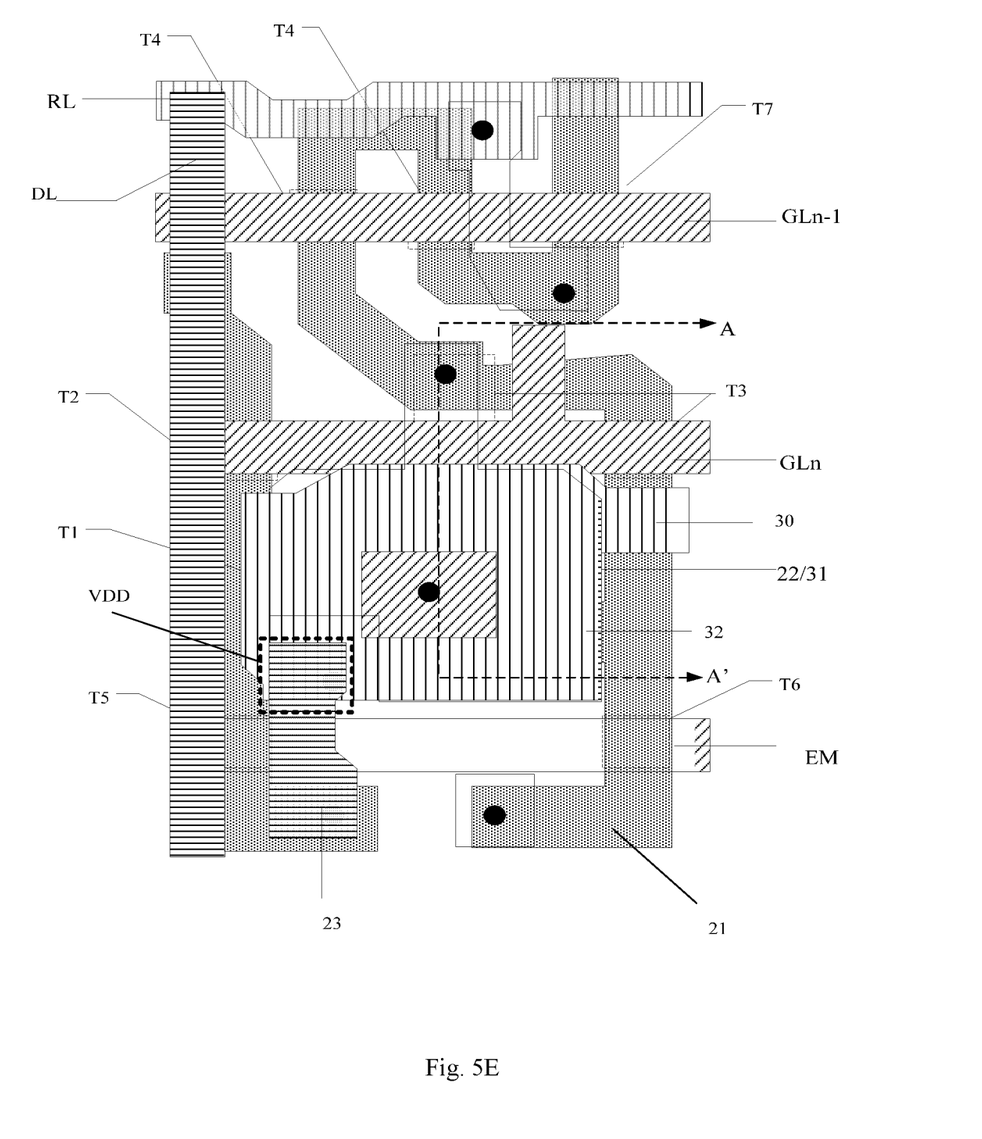
FIG. 5E is a top view corresponding to another step in the preparation of an array substrate according to an embodiment of the present disclosure.
Figure 5F:
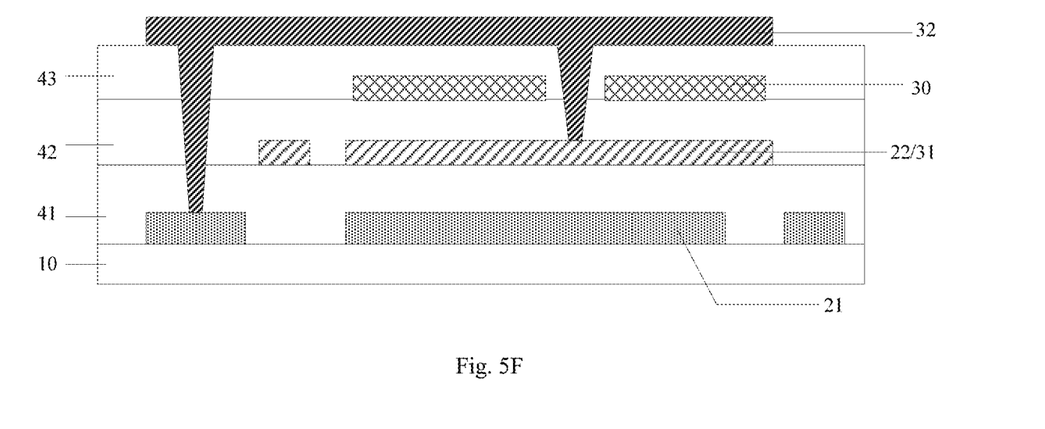
FIG. 5F is a section view of the array substrate shown in FIG. 5E in an AA' direction.

The structure of the array substrate finally formed by the above steps (1) to (8) is as shown in FIG. 5E and FIG. 5F, and FIG. 5F is a section view of the array substrate shown in FIG. 5E in an AA' direction.

In a specific implementation, the power supply voltage lines may be disposed in a display region of the array substrate, one power supply voltage line corresponds to one column of pixel circuits, of course, the power supply voltage line may also be disposed in a frame region of the array substrate, and the power supply voltage line is in lap joint with the pixel circuits through other metal film layers located in the display region, which is not limited herein.

According to the array substrate provided by the embodiments of the present disclosure, the storage capacitor is formed by connecting the first capacitor and the second capacitor in parallel, wherein the first capacitor is formed by the first electrode and the storage electrode, and the second capacitor is formed by the second electrode and the storage electrode. Therefore, compared with the prior art, the array substrate has the features that the capacitance value of the storage capacitor can be increased on the basis of the same occupied area, or the occupied area can be reduced on the basis of ensuring the same capacitance value of the storage capacitor, so that the pixel PPI of the display panel is improved in the same internal compensation pixel circuit structure.

Based on the same disclosed concept, embodiments of the present disclosure also provide an OLED display panel including any above array substrate provided by the embodiments of the present disclosure. Since the principle of solving the problem of the OLED display panel is similar to that of the aforementioned array substrate, the implementation of the OLED display panel may refer to the implementation of the aforementioned array substrate and will not be repeated herein.

Based on the same disclosed concept, embodiments of the present disclosure also provide a display device including any OLED display panel provided by the embodiments of the present disclosure. The display device may be: any product or component with a display function, such as a mobile phone, a tablet computer, a television, a display, a notebook computer, a digital photo frame and a navigator. The implementation of the display device may refer to the embodiments of the above OLED display pane and will not be repeated herein.

According to the array substrate, the OLED display panel and the display device provided by the embodiments of the present disclosure, the storage capacitor includes the first capacitor and the second capacitor which are connected in parallel, wherein the first capacitor includes the storage electrode and the first electrode, a layer where the first electrode is located is same as a layer where the grid electrode of the driving transistor is located, the second capacitor includes the storage electrode and the second electrode, a layer where the second electrode is located is same as a layer where the power supply voltage line is located, and the first electrode and the second electrode are electrically connected through the via hole penetrating through the first insulating layer and the second insulating layer. Therefore, compared with the prior art, the array substrate has the features that the capacitance value of the storage capacitor can be increased on the basis of the same occupied area, or the occupied area can be reduced on the basis of ensuring the same capacitance value of the storage capacitor, so that the pixel PPI of the display panel is improved in the same internal compensation pixel circuit structure.

Obviously, those skilled in the art can make various modifications and variations on the present disclosure without departing from the spirit and scope of the present disclosure. Thus, the present disclosure intends to cover these modifications and variations provided they come within the scope of the appended claims and equivalents thereof.

What is claimed is:

1. An array substrate, comprising:
    a base substrate; and
    a pixel circuit disposed on the base substrate;
    wherein the pixel circuit at least comprises:
        a driving transistor,
        a storage capacitor, and
        a power supply voltage line;
        wherein one end of the storage capacitor is electrically connected with the power supply voltage line, and the other end of the storage capacitor is electrically connected with a grid electrode of the driving transistor;
    an active layer, a grid insulating layer, the grid electrode of the driving transistor, a first insulating layer, a storage electrode, a second insulating layer and the power supply voltage line are sequentially disposed on the base substrate; and
    the storage capacitor comprises:
        a first capacitor; and
        a second capacitor;
        wherein the first capacitor and the second capacitor are connected in parallel;
        the first capacitor comprises:
            the storage electrode; and
            a first electrode;
            wherein a layer where the first electrode is located is same as a layer where the grid electrode of the driving transistor is located;
        the second capacitor comprises:
            the storage electrode; and
            a second electrode;
            wherein a layer where the second electrode is located is same as a layer where the power supply voltage line is located; and
            the first electrode and the second electrode are electrically connected through a via hole penetrating through the first insulating layer and the second insulating layer.

2. The array substrate according to claim 1, wherein:
    the storage electrode of the storage capacitor is electrically connected with the power supply voltage line; and
    the first electrode of the storage capacitor is electrically connected with the grid electrode of the driving transistor.

3. The array substrate according to claim 1, wherein:
    the storage electrode of the storage capacitor is electrically connected with the grid electrode of the driving transistor; and
    the second electrode of the storage capacitor is electrically connected with the power supply voltage line.

4. The array substrate according to claim 1, wherein an orthographic projection of the storage electrode on the base substrate has an overlapping area with an orthographic projection of the first electrode on the base substrate.

5. The array substrate according to claim 1 wherein an orthographic projection of the storage electrode on the base substrate has an overlapping area with an orthographic projection of the second electrode on the base substrate.

6. The array substrate according to claim 1, wherein an orthographic projection of the second electrode on the base substrate coincides with an orthographic projection of the first electrode on the base substrate.

7. The array substrate according to claim 1, further comprising:
    source and drain electrodes;
    wherein a layer where the source and drain electrodes are located is same as the layer where the power supply voltage line is located.

8. The array substrate according to claim 1, further comprising:
    a data line;
    wherein a layer where the data line is located is same as the layer where the power supply voltage line is located.

9. An OLED display panel, comprising: an array substrate, wherein the array substrate comprises:

a base substrate; and
a pixel circuit disposed on the base substrate;
wherein the pixel circuit at least comprises:
  a driving transistor,
  a storage capacitor, and
  a power supply voltage line;
  wherein one end of the storage capacitor is electrically connected with the power supply voltage line, and the other end of the storage capacitor is electrically connected with a grid electrode of the driving transistor;
  an active layer, a grid insulating layer, the grid electrode of the driving transistor, a first insulating layer, a storage electrode, a second insulating layer and the power supply voltage line are sequentially disposed on the base substrate; and
  the storage capacitor comprises:
    a first capacitor; and
    a second capacitor;
    wherein the first capacitor and the second capacitor are connected in parallel;
    the first capacitor comprises:
      the storage electrode; and
      a first electrode;
      wherein a layer where the first electrode is located is same as a layer where the grid electrode of the driving transistor is located;
    the second capacitor comprises:
      the storage electrode; and
      a second electrode;
      wherein a layer where the second electrode is located is same as a layer where the power supply voltage line is located, and
      the first electrode and the second electrode are electrically connected through a via hole penetrating through the first insulating layer and the second insulating layer.

10. The OLED display panel according to claim 9, wherein:
  the storage electrode of the storage capacitor is electrically connected with the power supply voltage line; and
  the first electrode of the storage capacitor is electrically connected with the grid electrode of the driving transistor.

11. The OLED display panel according to claim 9, wherein:
  the storage electrode of the storage capacitor is electrically connected with the grid electrode of the driving transistor; and
  the second electrode of the storage capacitor is electrically connected with the power supply voltage line.

12. The OLED display panel according to claim 9, wherein an orthographic projection of the storage electrode on the base substrate has an overlapping area with an orthographic projection of the first electrode on the base substrate.

13. The OLED display panel according to claim 9, wherein an orthographic projection of the storage electrode on the base substrate has an overlapping area with an orthographic projection of the second electrode on the base substrate.

14. The OLED display panel according to claim 9, wherein the orthographic projection of the second electrode on the base substrate coincides with an orthographic projection of the first electrode on the base substrate.

15. The OLED display panel according to claim 9, wherein the array substrate further comprises source and drain electrodes; wherein a layer where the source and drain electrodes are located is same as the layer where the power supply voltage line is located.

16. The OLED display panel according to claim 9, wherein the array substrate further comprises a data line; wherein a layer where the data line is located is same as the layer where the power supply voltage line is located.

17. A display device, wherein the display device comprises the OLED display panel according to claim 9.

* * * * *